(12) United States Patent
Yamasaki

(10) Patent No.: US 6,404,687 B2
(45) Date of Patent: *Jun. 11, 2002

(54) SEMICONDUCTOR INTEGRATED CIRCUIT HAVING A SELF-REFRESH FUNCTION

(75) Inventor: Kyoji Yamasaki, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/562,925

(22) Filed: May 2, 2000

(30) Foreign Application Priority Data

Oct. 27, 1999 (JP) .......................... 11-305703

(51) Int. Cl.$^7$ ................................. G11C 7/00

(52) U.S. Cl. ................... 365/222; 365/189.09; 365/236

(58) Field of Search ............................ 365/222, 189.09, 365/149, 236

(56) References Cited

U.S. PATENT DOCUMENTS 5,453,959 A * 9/1995 Sakuta et al. ................ 365/222
5,499,213 A * 3/1996 Niimi et al. ................. 365/222
5,566,117 A * 10/1996 Okamura et al. ........... 365/222
5,877,978 A * 3/1999 Morishita et al. .......... 365/149

FOREIGN PATENT DOCUMENTS

JP          5-217369          8/1993

* cited by examiner

*Primary Examiner*—Huan Hoang
(74) *Attorney, Agent, or Firm*—McDermott, Will & Emery

(57) ABSTRACT

A self-refresh circuit included in a semiconductor integrated circuit includes a ring oscillator, a double period counter, an SELF generating portion generating a signal SELF0 corresponding to an internal RAS, and a BBUE generating portion. The double period counter performs a count operation, using the output signal of the double period counter as a basic signal. The BBUE generating portion generates a BBUE signal in accordance with the output of double period counter. When the BBUE rises to H-level, the self-refresh signal SELF corresponding to signal SELF0 is issued. A layout area can be small, and timing of entry in a self-refresh mode can be finely set.

8 Claims, 18 Drawing Sheets

US 6,404,687 B2

1

SEMICONDUCTOR INTEGRATED CIRCUIT HAVING A SELF-REFRESH FUNCTION

BACKGROUND OF THE INVENTION

1. Field of the Invention

The present invention relates to a semiconductor integrated circuit, and particularly a semiconductor integrated circuit having a self-refresh function.

2. Description of the Background Art

Referring to FIG. 13, description will now be given on a self-refresh circuit 900 in an EDO-DRAM (extended data output DRAM).

Self-refresh circuit 900 includes, as shown in FIG. 13, a self-refresh-in circuit 901 which generates a timing signal determining timing of entry in a self-refresh mode (referred to as "a BBUE signal" hereinafter), and a self-period timer 902 which issues a self-refresh signal SELF.

Self-refresh-in circuit 901 generates the BBUE signal when tens of microseconds elapse after a CBR (CAS before RAS) signal attains H-level. Self-period timer 902 receives the BBUE signal, and issues self-refresh signal SELF, which is a pulse signal of one shot, every 16 μs.

The CBR signal attains H-level when so-called "CBR conditions" are satisfied. Under the "CBR conditions", an external column address strobe signal /CAS falls prior to external row address strobe signal /RAS.

Self-refresh-in circuit 901 includes a ring oscillator 903 which issues an oscillation signal φ0 having a period of T0 in response to the CRB signal, a double period counter 904 which performs counting based on oscillation signal φ0, and a BBUE generating portion 905 which generates the BBUE signal in accordance with the output of double period counter 904.

As shown in FIG. 14, ring oscillator 903 includes an NAND circuit 916, inverters 917#1–917#6 connected in series, an NOR circuit 918 and an inverter 919. NAND circuit 916 receives on its inputs the CBR signal and the output of inverter 917#6. NOR circuit 918 receives on its inputs the BBUE signal and the output of inverter 917#6. Inverter 919 inverts the output of NOR circuit 918, and issues oscillation signal φ0. Oscillation signal φ0 is at H-level during standby.

Double period counter 904 is a counter of n bits. In the case of n=3, it issues signals fx(0), fx(1) and fx(2) based on oscillation signal φ0.

BBUE generating portion 905 includes, as shown in FIG. 15, an NOR circuit 910 which receives output signals fx(O)–fx(2) of double period counter 904, an NAND circuit 911 which receives on its inputs the CBR signal and the output of NOR circuit 910, and an inverter 912 which inverts the output of NAND circuit 911 to issue the BBUE signal.

For example, as shown in FIG. 16, when oscillation signal φ0 of period T0 is supplied to double period counter 904, it issues signals fx(0), fx(1) and fx(2) having periods of (2×T0), (4×T0) and (8×T0), respectively. Assuming that BBUE generating portion 905 receives signals fx(0), fx(1) and fx(2) having periods of (2×T0), (4×T0) and (8×T0), respectively, it generates the BBUE signal having a period of (8×T0=$2^n$×T0).

In the self-refresh-in circuit 901, when the BBUE signal attains H-level, oscillation signal φ0 is fixed to H-level. In the practical operation, therefore, the BBUE signal holds the H-level until the CBR signal attains L-level (i.e., until reset).

Self-period timer 902 shown in FIG. 13 includes a ring oscillator 906 which issues an oscillation signal φ1 of a

2 period T1 in response to the BBUE signal, a double period counter 907 which performs a count operation based on oscillation signal φ1, and a SELF generating portion 908 which issues self-refresh signal SELF in accordance with the output of double period counter 907.

Ring oscillator 906 is formed of an NAND circuit 916 and inverters 917#1–917#6, as shown in FIG. 17.

Double period counter 907 is a counter of m bits. In the case of m=4, double period counter 907 issues sisals fy(0) –fy(4) based on oscillation signal φ1. As shown in FIG. 18, signals fy(0), fy(1), fy(2) and fy(3) have periods of (2×T1), (4×T1), (8×T1) and (16×T1), respectively.

SELF generating portion 908 has a structure similar to that of foregoing BBUE generating portion 905, and issues self-refresh signal SELF of one shot at H-level when all signals fy(0)–fy(3) attains L-level. Self-refresh signal SELF has a period Ts (self-refresh period) equal to (16×T1=$2^n$×T1).

An operation of a conventional semiconductor integrated circuit in a self-refresh mode will now be described with reference to FIG. 19. It is assumed that double period counter 904 issues fx(0)–fx(2), and double period counter 907 issues fy(0)–fy(3).

When external row address strobe signal /RAS falls to L-level after external column address strobe signal /CAS fell to L-level, the CBR signal at H-level representing the fact that the CBR conditions are satisfied is issued (time t0). After (8×T0), the BBUE signal attains H-level. A period (self-in period) which elapses until the operation enters the self-refresh mode after the CBR signal attains H-level until is equal to (8×T0).

In response to the above, self-refresh signal SELF is issued. Self-refresh period Ts is equal to (16×T1). In synchronization with self-refresh signal SELF, internal row address strobe signal (internal RAS) is issued. In response to this internal RAS, the operation of selecting the row in the memory cell array is conducted.

Assuming that T0 is equal to 16 μs and T1 is equal to 1 μs, the BBUE signal attains H-level when 80 μs elapses after the CBR signal attains H-level, and the self-refresh period Ts goes to 16 μs.

In the self-refresh-in circuit, the ring oscillator stops after the BBUE is issued. The self-refresh period is changed by tuning.

In the conventional semiconductor integrated circuit, as already described, each of self-refresh-in circuit 901 and self-period timer circuit 902 includes a ring oscillator and a counter which are independent of those in the other.

However, such independent provision of the ring oscillators and the counters unpreferably increases the layout area of the semiconductor integrated circuit.

SUMMARY OF THE INVENTION

Accordingly, the invention provides a semiconductor integrated circuit, which can execute a desired self-refresh operation with a reduced layout area.

A semiconductor integrated circuit according to the invention includes a memory cell array including a plurality of memory cells arranged in rows and columns, and a self-refresh circuit for issuing a self-refresh signal determining a self-refresh period for selection of the row in the memory cell array in a self-refresh mode, the self refresh circuit including a ring oscillator receiving a specific signal and issuing an oscillation signal, a counter receiving the oscillation signal, and issuing count signals of m bits (m: natural number), a pulse signal generating circuit generating a pulse signal based on the count signals of m bits, a self-in signal generating circuit for generating a self-in signal in response to the output of the counter after a predetermined period from entry of the specific signal, and a circuit for generating the self-refresh signal based on the pulse signal based in response to the self-in signal.

According to the semiconductor integrated circuit of the above first aspect, the single ring oscillator is used for determining the self-refresh period and the timing (self-refresh-in period) of entry in the self-refresh mode. Therefore, the layout area can be smaller than that in the prior art.

Preferably, the self-in signal generating circuit includes a self-in-capable counter using one of the count signals of m bits as a basic signal, and issuing count signals of n bits (n: natural number), and a generating circuit for generating the self-in signal based on at least one of the count signals of n bits.

According to the above second aspect, the semiconductor integrated circuit of the first aspect further has such a feature that the self-refresh-in period is determined using, as the basic signal, the counter output used for determining the self-refresh period. Accordingly, the counter for determining the self-refresh period can be smaller than that in the prior art.

In particular, the predetermined period is K times (K relates to the foregoing "n", and is an integer not equal to $2^n$) larger than the period of the basic signal supplied to the self-in-capable counter.

According to the above third aspect, the semiconductor integrated circuit of the second aspect further has such a feature that the self-refresh-in period is K times (K is an integer not equal to $2^n$) lager than the basic period. Accordingly, such setting is allowed that the operation can enter the self-refresh mode in accordance with desired timing.

Preferably, the self-in signal generating circuit further includes a timing adjusting circuit having a fuse for issuing adjusting signals of L bits (L: natural number), each of the adjusting signals of L bits has a logical level determined independently of the others in accordance with the state of the fuse, and the generating circuit generates the self-in signal based on a combination of the count signals of n bits and the adjusting signals of L bits.

According to the above fourth aspect, the semiconductor integrated circuit of the second aspect further has such a feature that the fuse and the count value can be combined for fine setting of the self-refresh-in period. Accordingly, setting for entry in the self-refresh mode in accordance with desired timing can be achieved.

Preferably, the predetermined period is substantially J times or (J+0.5) times larger than the self-refresh period (J: integer).

According to the above fifth aspect, the semiconductor integrated circuit of the first aspect further has such a feature that the self-refresh-in period can be J times or (J+0.5) times larger than the self-refresh period (J: integer). Accordingly, setting for entry in the self-refresh mode in accordance with desired timing can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
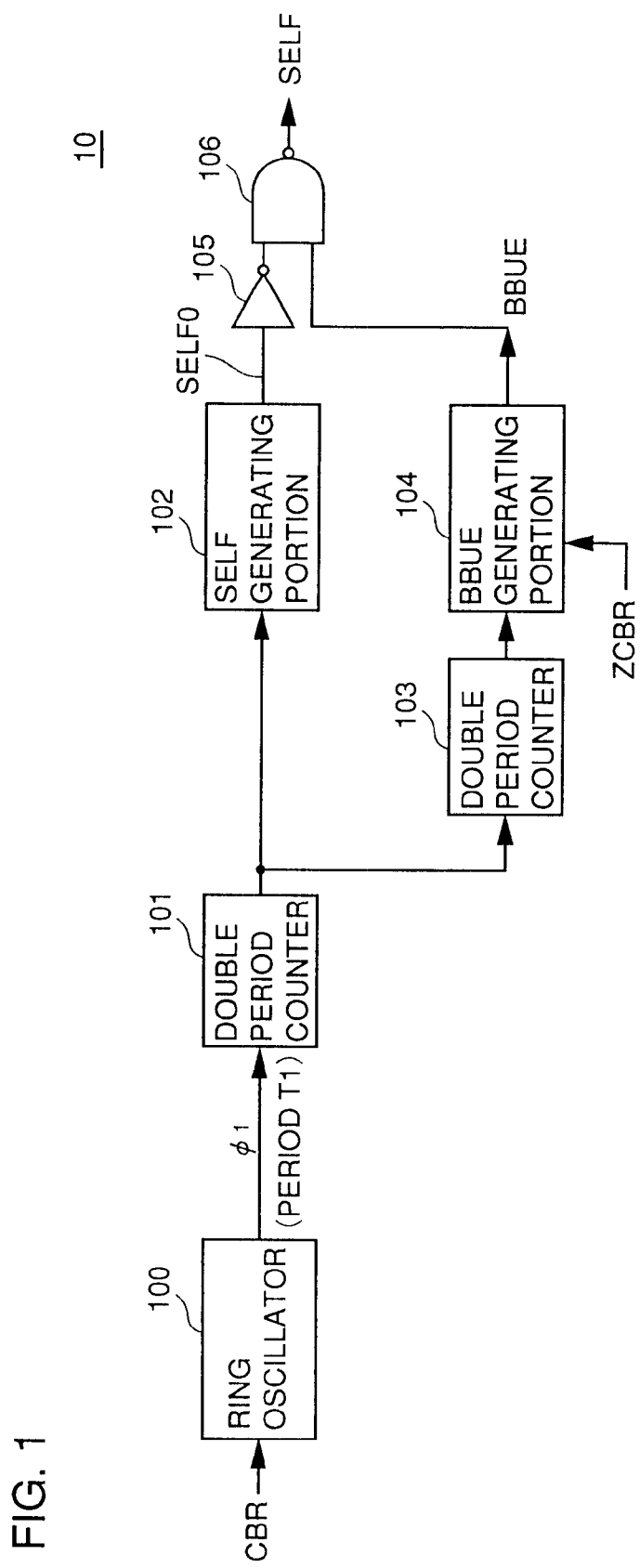
FIG. 1 is a block diagram of a self-refresh circuit 10 of a first embodiment of the invention.

Semiconductor integrated circuits according to the invention will now be described in greater detail with reference to the drawings. In the drawings, the same or corresponding portions bear the same reference numbers or characters, and description thereof will not be repeated.

[First Embodiment]

A structure of a self-refresh circuit 10 according to a first embodiment of the invention will now be described with reference to FIG. 1. Self-refresh circuit 10 according to the first embodiment of the invention includes, as shown in FIG. 1, a ring oscillator 100 issuing an oscillation signal φ1, a double period counter 101 which executes counting in accordance with oscillation signal φ1, a SELF generating portion 102 which issues a pulse signal in accordance with the output of double period counter 101, a double period counter 103 which can handle a BBUE signal and executes counting in accordance with the output of double period counter 101, a BBUE generating portion 104 which receives on its inputs the output of double period counter 103 and a ZCBR signal formed by inverting the CBR signal, and issues the BBUE signal determining the timing of entry in the self-refresh mode, an inverter 105 which inverts the output of SELF generating portion 102, and an NAND circuit 106 which receives the output of inverter 105 and the BBUE signal, and issues self-refresh signal SELF.

For example, ring oscillator 100 has the same structure as ring oscillator 906, and issues oscillation signal φ1 of period T1 when it receives the CBR signal at H-level.

Figure 2:
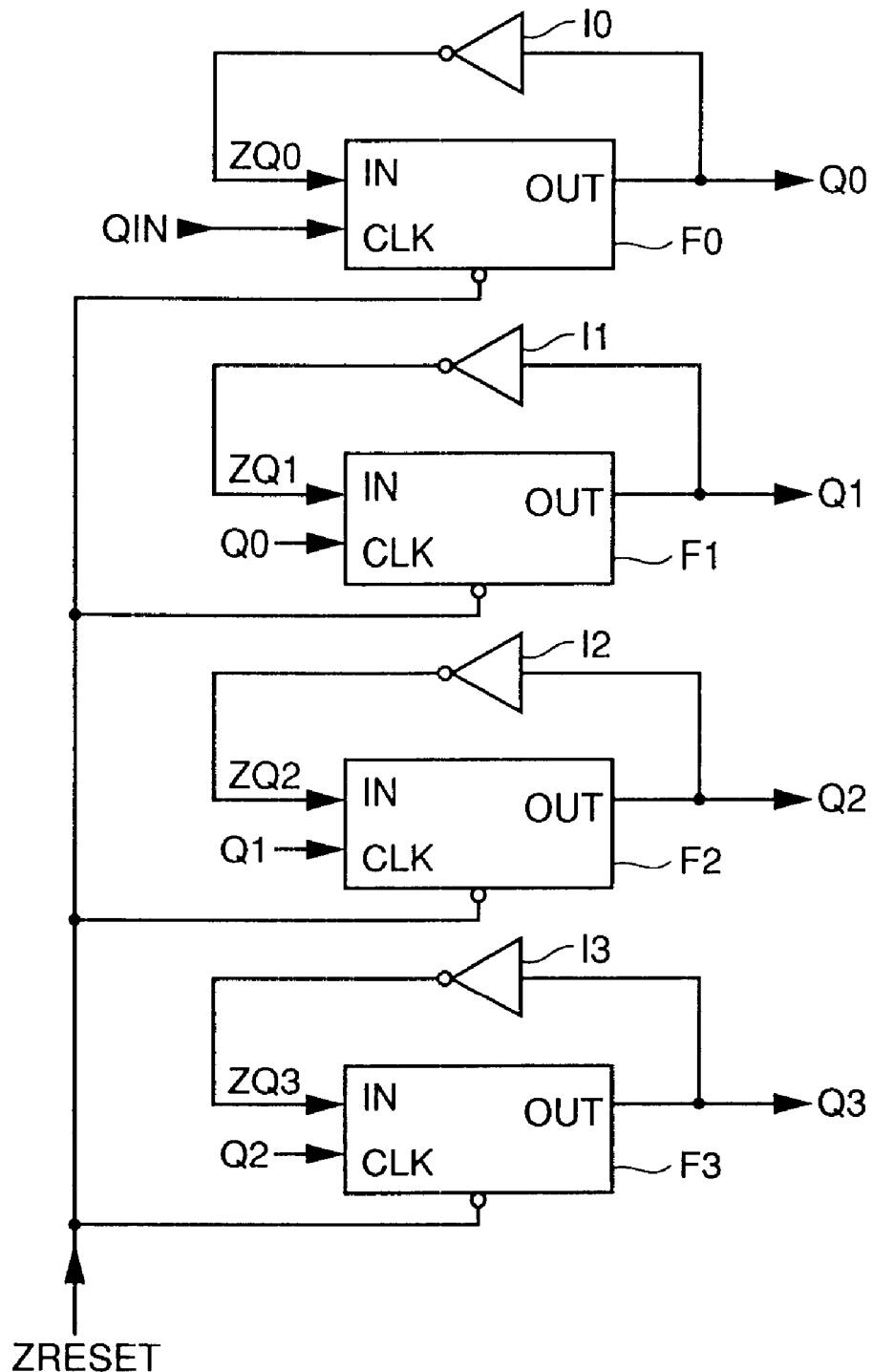
FIG. 2 shows by way of example a structure of a double period counter 101.

Double period counter 101 is a counter of m bits. FIG. 2 shows an example of double period counter 101 of 4 bits (m=4). The circuit shown in FIG. 2 includes flip-flops F0–F3 and inverters I0–I3. Each of flip-flops F0–F3 is reset by a reset signal ZRESET. Each of flip-flops F0–F3 has a clock terminal CLK, an input terminal IN and an output terminal OUT.

Signals Q0–Q3 on output terminals OUT of flip-flops F0–F3 are externally sent from terminals Q0–Q3, respectively. Flip-flops F0–F3 are supplied on their inputs IN with signals ZQ0–ZQ3 formed by inverting signals Q0–Q3, respectively. A basic signal QIN received on a terminal QIN is supplied to clock terminal CLK of flip-flop F0. Clock terminals of flip-flops F1, F2 and F3 are supplied with signals Q0, Q1 and Q2, respectively. A period of each of signals Q0 and Q1 can be tuned.

Terminal QIN of double period counter 101 receives oscillation signal φ1. Signals issued from terminals Q0–Q3 of double period counter 101 are indicated by f(0)–f(3), respectively.

Figure 3:
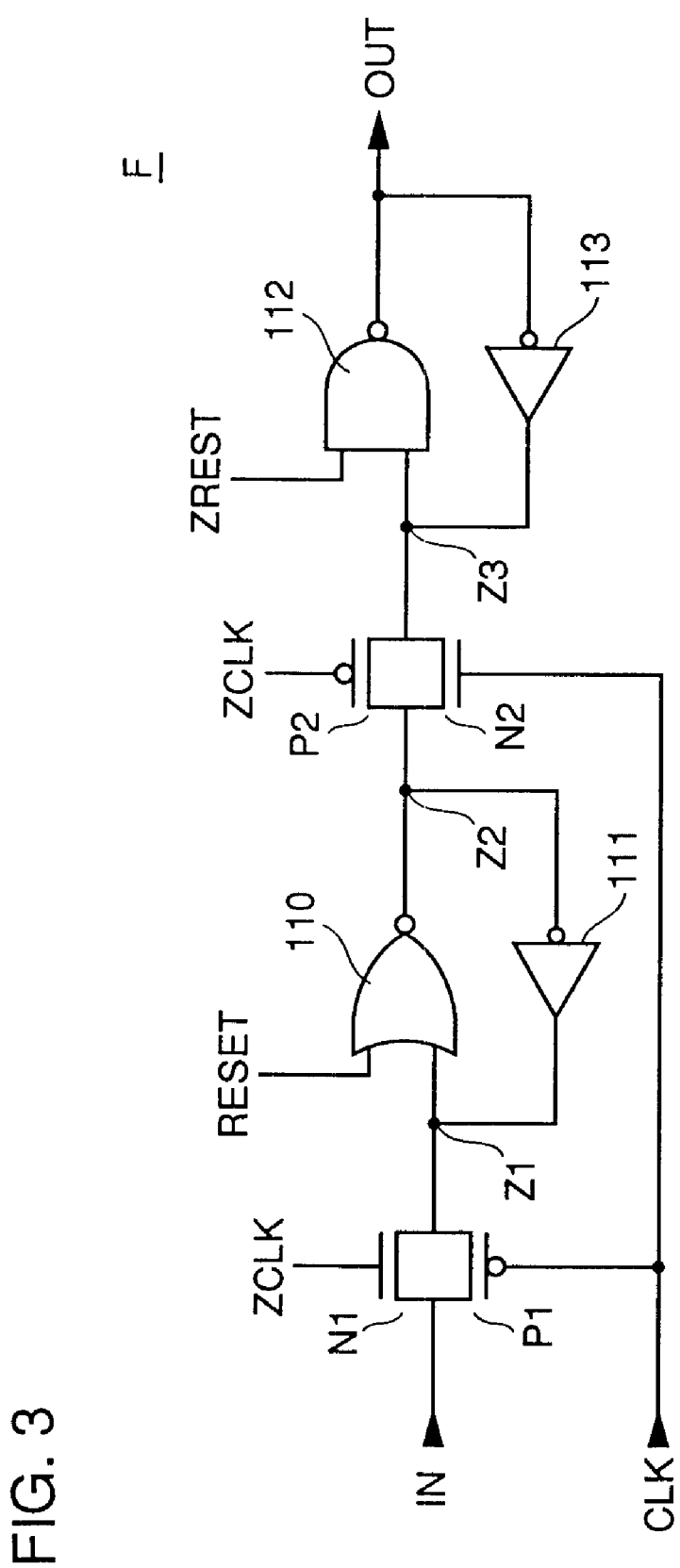
FIG. 3 is a circuit diagram showing a structure of a flip-flop F.

Each flip-flop has a structure shown in FIG. 3. As shown in FIG. 3, each flip-flop F has a gate formed of an NMOS transistor N1 and a PMOS transistor P1, a latch circuit formed of an NOR circuit 110 and an inverter 111, a gate formed of a PMOS transistor P2 and an NMOS transistor N2, and a latch circuit formed of an NAND circuit 112 and an inverter 113.

Transistors N1 and P1 are arranged between input terminal IN and a node Z1, and transistors P2 and N2 are arranged between nodes Z2 and Z3. NOR circuit 110 and inverter 111 are arranged between nodes Z1 and Z2, and NAND circuit 112 and inverter 113 are arranged between a node Z3 and output terminal OUT.

In the figure, "ZCLK" indicates a signal formed by inverting the signal received on clock terminal CLK, and "RESET" indicates a signal formed by inverting reset signal ZRESET.

Signals f(0), f(1) and f(3) have periods of (2×T1), (4×T1) and (16×T1), respectively, where T1 is a period of oscillation signal φ1.

SELF generating portion 102 shown in FIG. 1 issues a pulse signal of one shot in accordance with signals f(0)–f(3). For example, SELF generating portion 102 is formed of NOR circuits receiving signals f(0)–f(3), respectively. The output of SELF generating portion 102 is represented as a signal SELF0. The period of pulse signal SELF0 is equal to ($2^m$×T) and thus (16×T1).

Figure 4:
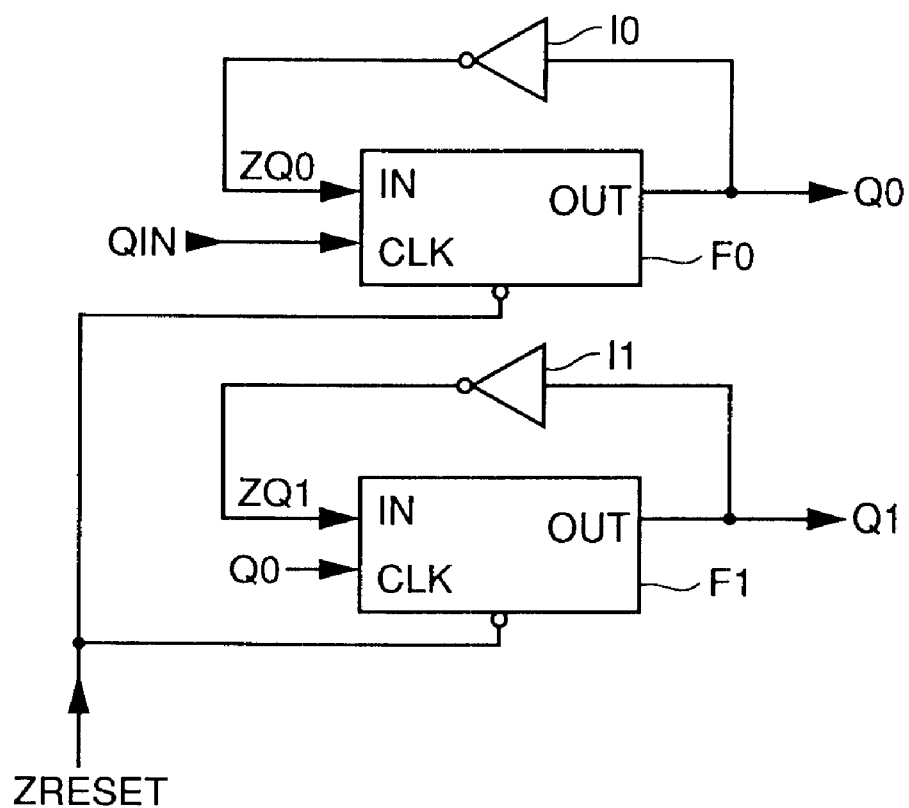
FIG. 4 shows by way of example a structure of a double period counter 103.

Double period counter 103 shown in FIG. 1 is a counter of n bits. FIG. 4 shows an example of double period counter 103 of 2 bits (n=2). The circuit shown in FIG. 4 includes flip-flops F0 and F1 as well as inverters I0 and I1. Signals Q0 and Q1 on output terminals OUT of flip-flops F0 and F1 are externally issued from terminals Q0 and Q1, respectively, Flip-flops F0 and F1 are supplied on their input terminals IN with signals ZQ0 and ZQ1 formed by inverting signals Q0 and Q1, respectively. Basic signal QIN is supplied to clock terminal CLK of flip-flop F0. Clock terminal CLK of flip-flop F1 receives signal Q0.

Terminal QIN of double period counter 103 receives signal f(3). Double period counter 103 issues from terminals Q0 and Q1 the signals indicated by g(0) and g(1), respectively. Assuming that signal f(3) has a period T (=16×T1), signals g(0) and g(1) have periods of (2×T) and (4×T), respectively.

Figure 5:
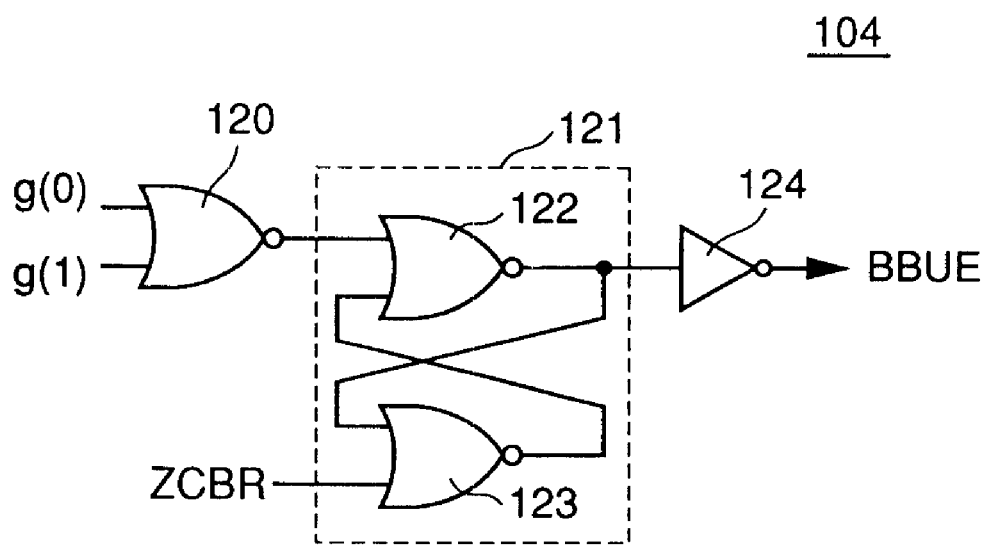
FIG. 5 is a circuit diagram showing by way of example a structure of a BBUE generating portion 104.

A structure of BBUE generating portion 104 shown in FIG. 1 will now be described with reference to FIG. 5. As shown in FIG. 5, BBUE generating portion 104 includes an NOR circuit 120 receiving signals g(0) and g(1), a circuit 121 formed of NOR circuits 122 and 123, and an inverter 124 issuing the BBUE signal.

NOR circuit 122 receives on its inputs the outputs of NOR circuits 120 and 123, respectively. NOR circuit 123 receives on its inputs the output of NOR circuit 122 and signal ZCBR formed by inverting the CBR signal. Inverter 124 issues the BBUE signal by inverting the output of NOR circuit 122. The timing of rising of the BBUE signal depends on the three signals issued from double period counter 103.

According to the first embodiment of the invention, ring oscillator 100, double period counter 101 and SELF generating portion 102 issue signal SELF0 in response to the CBR signal. In response to output signal f(3) of double period counter 101, double period counter 103 and BBUE generating portion 104 issue the BBUE signal at H-level. Self-refresh signal SELF synchronized with signal SELF0 is issued.

Figure 6:
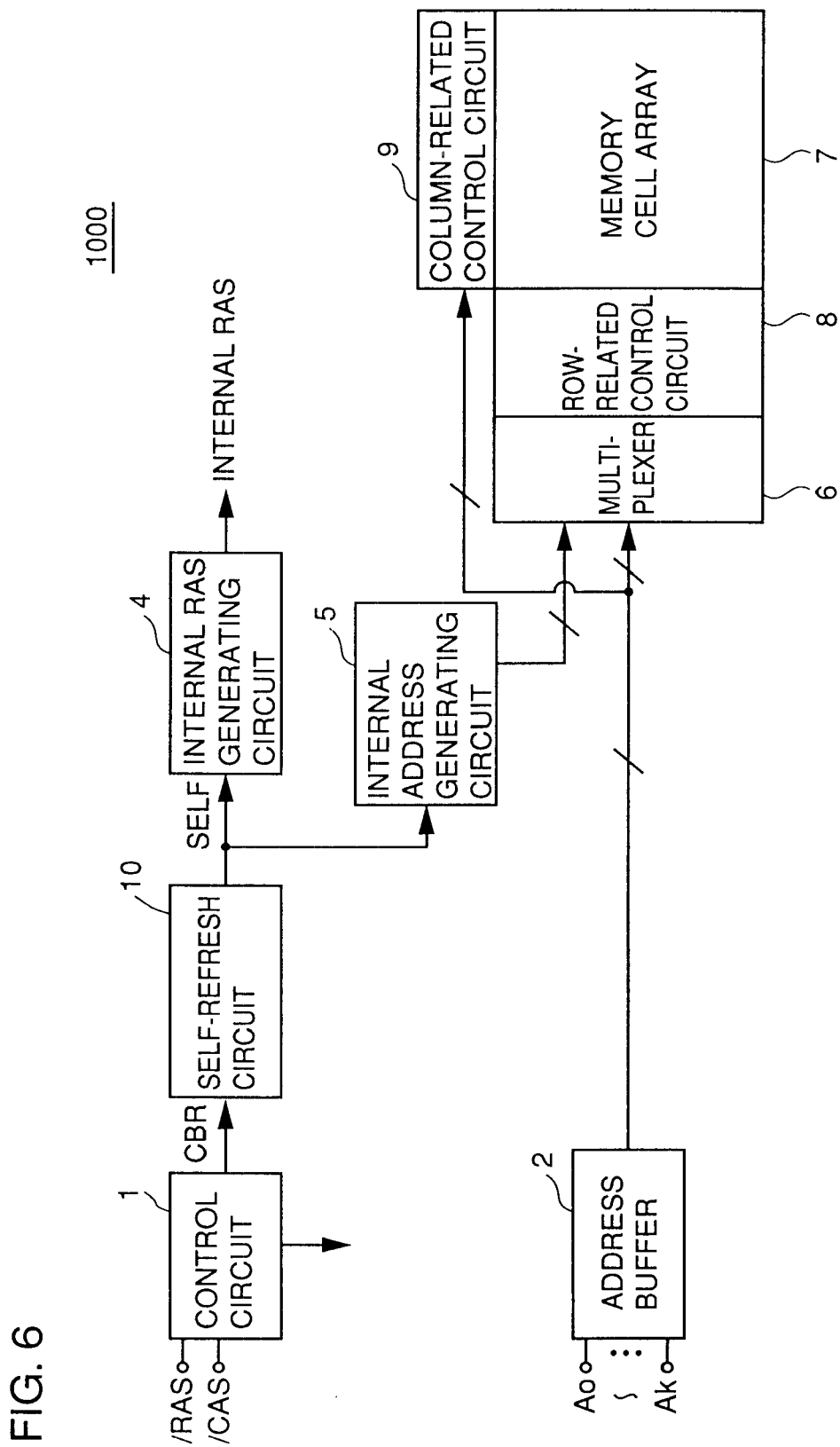
FIG. 6 is a block diagram showing a schematic structure of a semiconductor integrated circuit 1000 of the first embodiment of the invention.

A schematic structure of a semiconductor integrated circuit 1000 provided with self-refresh circuit 10 will now be described with reference to FIG. 6. As shown in FIG. 6, semiconductor integrated circuit 1000 includes a control circuit 1 which receives external control signals and issues internal control signals, an address buffer 2 which receives external address signals A0–Ak and issues an internal address, a self-refresh circuit 10 which receives the CBR-signal issued from control circuit 1, and issues self-refresh signal SELF, an internal RAS generating circuit 4 which generates an internal row address strobe signal (internal RAS) in response to self-refresh signal SELF, and an internal address generating circuit 5 which generates the internal address in response to self-refresh signal SELF.

Control circuit 1 receives, e.g., external row address strobe signal /RAS and external column address strobe signal /CAS, and issues internal row address strobe signal RAS and internal column address strobe signal CAS. Control circuit 1 further issues the CBR signal at H-level when it detects the "CBR conditions" which causes falling of external column address strobe signal /CAS prior to falling of external row address strobe signal /RAS.

Semiconductor integrated circuit 1000 further includes a multiplexer 6 which operates in the normal operation mode to issue the internal row address sent from address buffer 2, and operates in the self-refresh mode to issue the internal row address sent from internal address generating circuit 5, a memory cell array 7 which includes a plurality of memory cells arranged in rows and columns, a plurality of word lines provided corresponding to the respective rows and a plurality of bit lines provided corresponding to the respective columns, a row-related control circuit 8 which operates in accordance with the internal row address strobe signal issued from control circuit 1 or the internal RAS generated from internal RAS generating circuit 4, and thereby executes the row selecting operation based on the output of multiplexer 6, and a column-related control circuit 9 which performs the column selection and the control based on the internal column address sent from address buffer 2. In the self-refresh mode, rows in the memory cell array 7 are selected in accordance with the self-refresh period.

Figure 7:
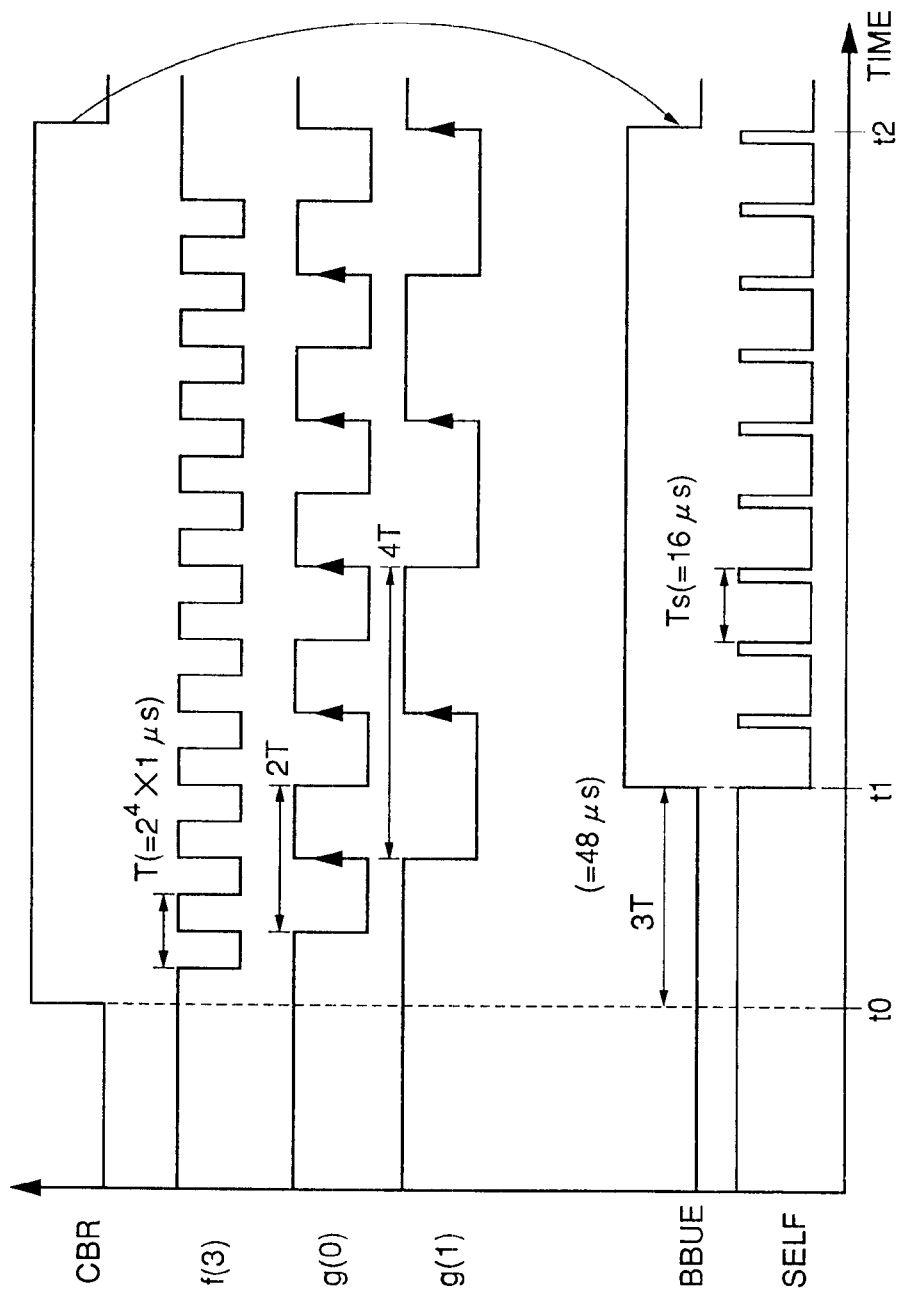
FIG. 7 is a timing chart for showing an operation in the self-refresh mode of the semiconductor integrated circuit of the first embodiment of the invention.

The operation in the self-refresh mode of the semiconductor integrated circuit according to the first embodiment of the invention will now be described with reference to a timing chart of FIG. 7. When the CBR signal rises to H-level in accordance with the CBR conditions (time t0), ring oscillator 100 issues oscillation signal φ1 of period T1. In response to this, double period counter 101 issues signals f(0)–f(3). Assuming that period T1 in this operation is 1 μs, signal f(3) has period T of (16×T1=16 μs).

Double period counter 103 receives signal f(3), and issues signals g(0) and g(1). Signals g(0) and g(1) have periods of 2t and 4T, respectively.

The BBUE signal rises to H-level when signals g(0) and g(1) attain L-level (time t1). More specifically, the BBUE signal attains H-level when $((2^n-1)\times T)$ (n=2) elapses after the CBR signal attains H-level. Accordingly, the self-in period, which is the period from rising of the CBR signal to rising of the BBUE signal to H-level, is equal to 3 T. Assuming that period T is equal to 16 μs, the self-in period is equal to 16×3 μs.

SELF generating portion 102 issues pulse signal SELF0 having a self-refresh period Ts (=T). When the BBUE signal attains H-level, self-refresh signal SELF having self-refresh period Ts is issued.

Ring oscillator 100 continues its operation until the CRB signal falls to L-level (time t2). BBUE generating portion 104 lowers the BBUE signal to L-level when the CRB signal falls to L-level. As a result, self-refresh circuit 10 issues self-refresh signal SELF of period Ts during a period between times t1 and t2. Based on this, the internal RAS and the internal address are issued, and the self-refresh operation is effected on the memory cell array 7.

According to the semiconductor integrated circuit of the first aspect of the invention, as described above, the ring oscillator is commonly used by the circuit, which determines the timing (self-in period) of entry in the self-refresh mode, and the circuit generating the self-refresh signal. Accordingly, the layout area is reduced.

A portion of the counter is commonly used by the circuit determining the self-in period and the circuit generating the self-refresh signal. Accordingly, double period counter 103 is required to issue merely the count signal of 2 bits. This allows further reduction in layout area.

BBUE generating portion 104 is not restricted to the structure described above. The output signal of double period counter 101 and the output signal of double period counter 103 may be combined to generate the BBUE signal supplied to NOR circuit 120.

[Second Embodiment]

Description will now be given on a self-refresh circuit according to a second embodiment of the invention. The self-refresh circuit according to the second embodiment of the invention employs a double period counter 203 of 3 bits instead of double period counter 103, and also employs a BBUE generating portion 204 instead of BBUE generating portion 104.

Figure 8:
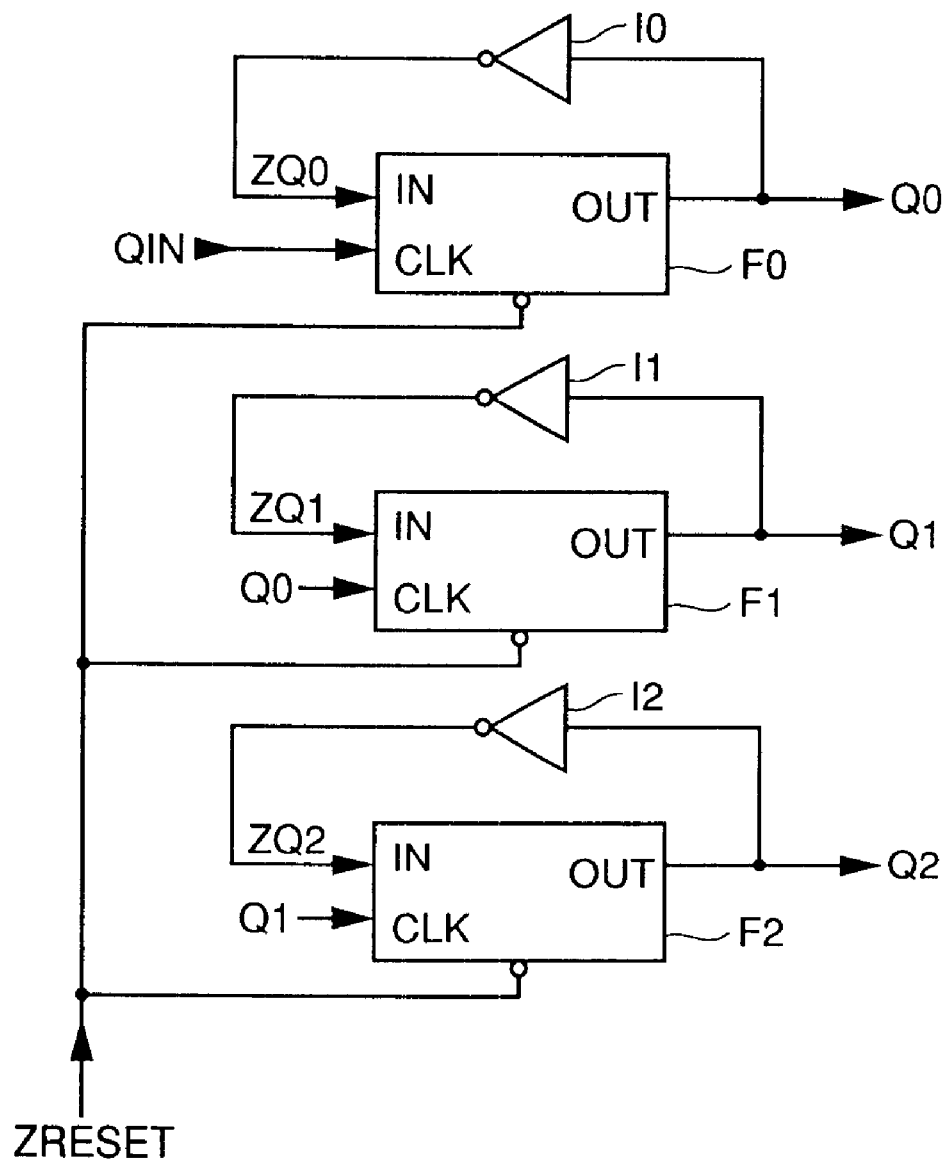
FIG. 8 shows by way of example a structure of a double period counter 203.

FIG. 8 shows an example of double period counter 203 of 3 bits. The circuit shown in FIG. 8 includes flip-flops F0–F2 and inverters I0–I2. Signals Q0–Q2 on output terminals OUT of flip-flops F0–F2 are externally issued from terminals Q0–Q2, respectively. Flip-flops F0–F1 are supplied on their input terminals IN with signals ZQ0–ZQ2 formed by inverting signals Q0–Q2. Basic signal QIN received on terminal QIN is supplied to clock terminal CLK of flip-flop F0. Flip-flop F1 is supplied on its clock terminal CLK with signal Q0, and flip-flop F2 is supplied on its clock terminal CLK with signal Q1.

Double period counter 203 is supplied on its terminal QIN with output signal f(3) of double period counter 101. The signals which are issued from terminals Q0, Q1 and Q2 of double period counter 203 in this operation are indicated by g(0), g(1) and g(2), respectively.

Figure 9:
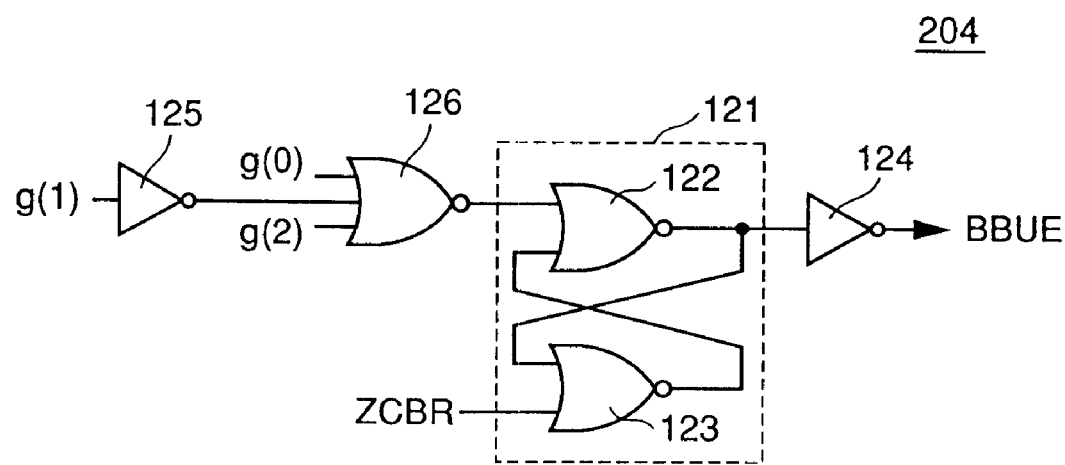
FIG. 9 is a circuit diagram showing by way of example a structure of a BBUE generating portion 204 of a second embodiment of the invention.

BBUE generating portion 204 includes, as shown in FIG. 9, an inverter 125 which inverts output signal g(1) of double period counter 203, an NOR circuit 126 which receives output signals g(0) and g(2) of double period counter 203 as well as the output of inverter 125, a circuit 121 formed of NOR circuits 122 and 123, and an inverter 124 which issues the BBUE signal. NOR circuit 122 receives on its inputs the outputs of NOR circuits 126 and 123, respectively.

Figure 10:
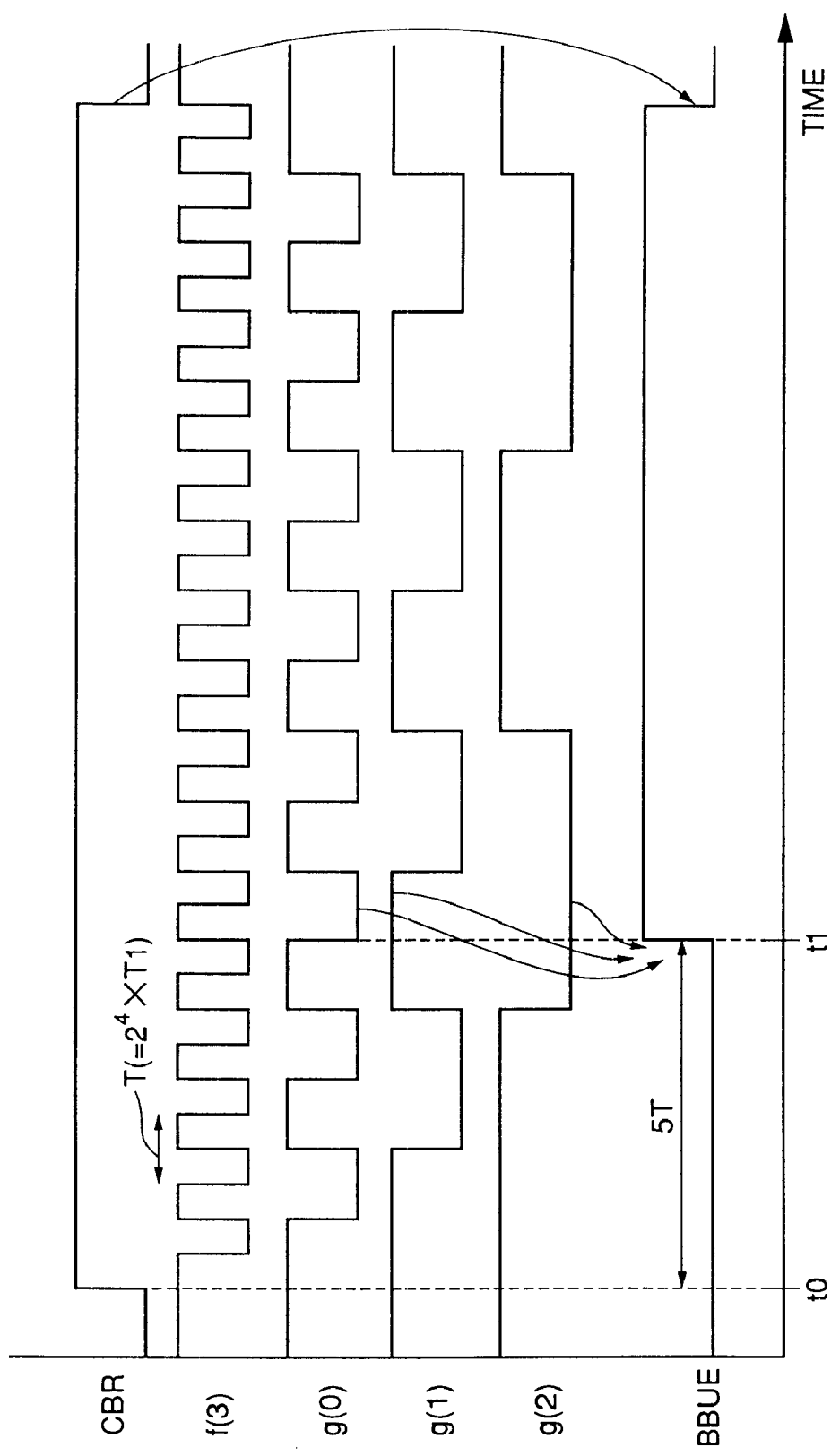
FIG. 10 is a timing chart for showing an operation in the self-refresh mode of the second embodiment of the invention.

An operation in the self-refresh mode in the second embodiment of the invention will now be described with reference to FIG. 10. When the CBR signal rises to H-level (time t0), double period counter 101 issues signal f(3) of the period of T. Double period counter 203 issues signals g(0), g(1) and g(2) having the periods of 2T, 4T and 8T, respectively.

When signal g(0) and g(2) attain L-level and signal g(1) attains H-level (time t1), the BBUE signal rises to H-level. The self-in period between times t1–t0 is equal to (5×T).

When BBUE signal attains H-level, self-refresh signal SELF having the self-refresh period of Ts (=T) is issued.

According to the self-refresh circuit of the second embodiment of the invention, as described above, the layout area is reduced. By using the output of counter and the signal formed by inverting the output of counter in combination, the BBUE signal can be issued in accordance with finely controlled timing. The structure of BBUE generating portion 204 is not restricted to the above structure, and the above combination of signals may further contain the output signal of double period counter 101 for issuing the BBUE signal. For example, signals f(3), g(0), g(1) and g(2) may be applied to NOR circuit 126.

[Third Embodiment]

A self-refresh circuit of a third embodiment of the invention will now be described. The self-refresh circuit according to the third embodiment of the invention employs double period counter 203 instead of double period counter 103, and also employs a BBUE generating portion 304 shown in FIG. 11 instead of BBUE generating portion 104.

Figure 11:
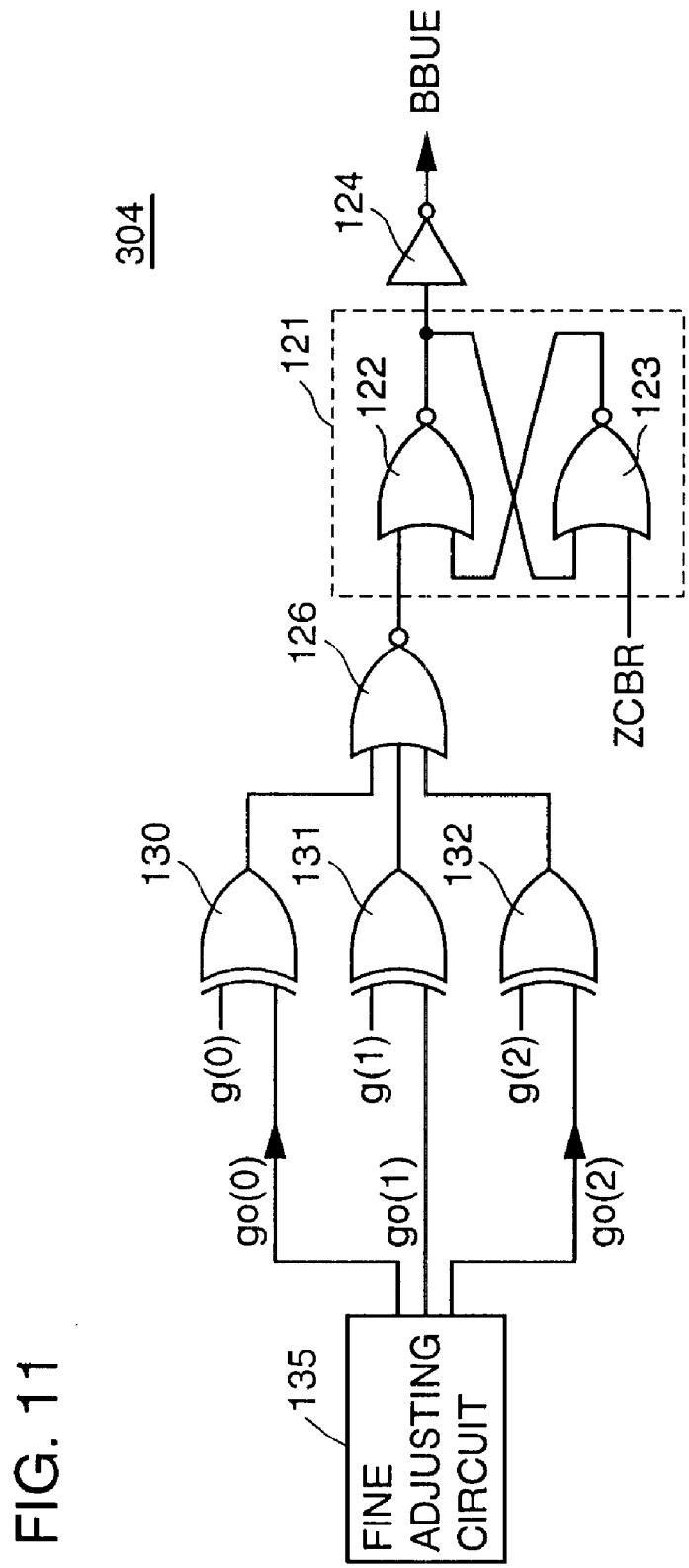
FIG. 11 is a circuit diagram showing by way of example a structure of a BBUE generating portion 304 of a third embodiment of the invention.

BBUE generating portion 304 includes, as shown in FIG. 11, EXOR circuits 130, 131 and 132, NOR circuit 126, circuit 121 formed of NOR circuits 122 and 123, inverter 124 issuing the BBUE signal and a fine adjusting circuit 135.

Fine adjusting circuit 135 issues signals g0(0)–g0(2). EXOR circuits 130 receives output signal g(0) of double period counter 203 and output signal g0(0) of fine adjusting circuit 135. EXOR circuit 131 receives output signal g(1) of double period counter 203 and output signal g0(1) of fine adjusting circuit 135. EXOR circuit 132 receives output signal g(2) of double period counter 203 and output signal g0(2) of fine control circuit 135. NOR circuit 126 receives the outputs of EXOR circuits 130, 131 and 132.

Figure 12:
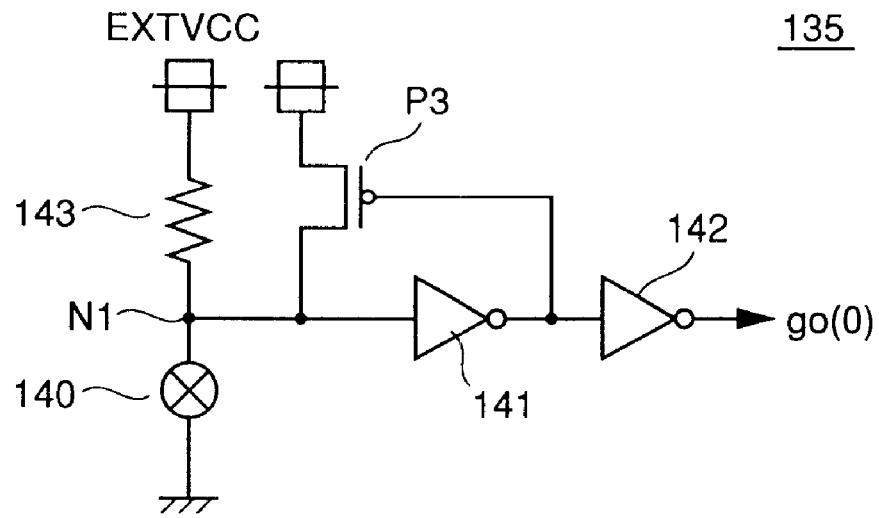
FIG. 12 is a circuit diagram showing by way of example a structure of a fine adjusting circuit 135.
Figure 15:
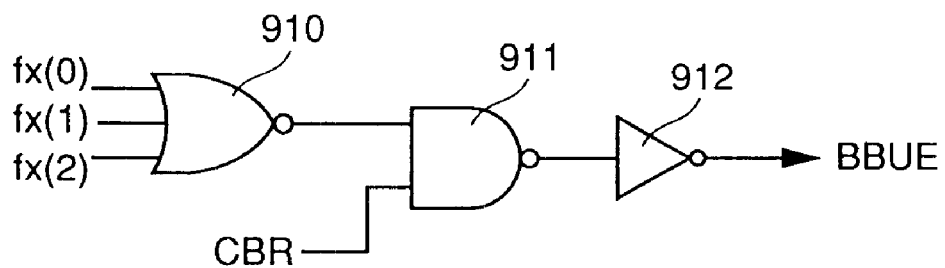
FIG. 15 is a circuit diagram showing a structure of a BBUE generating portion 905.
Figure 13:
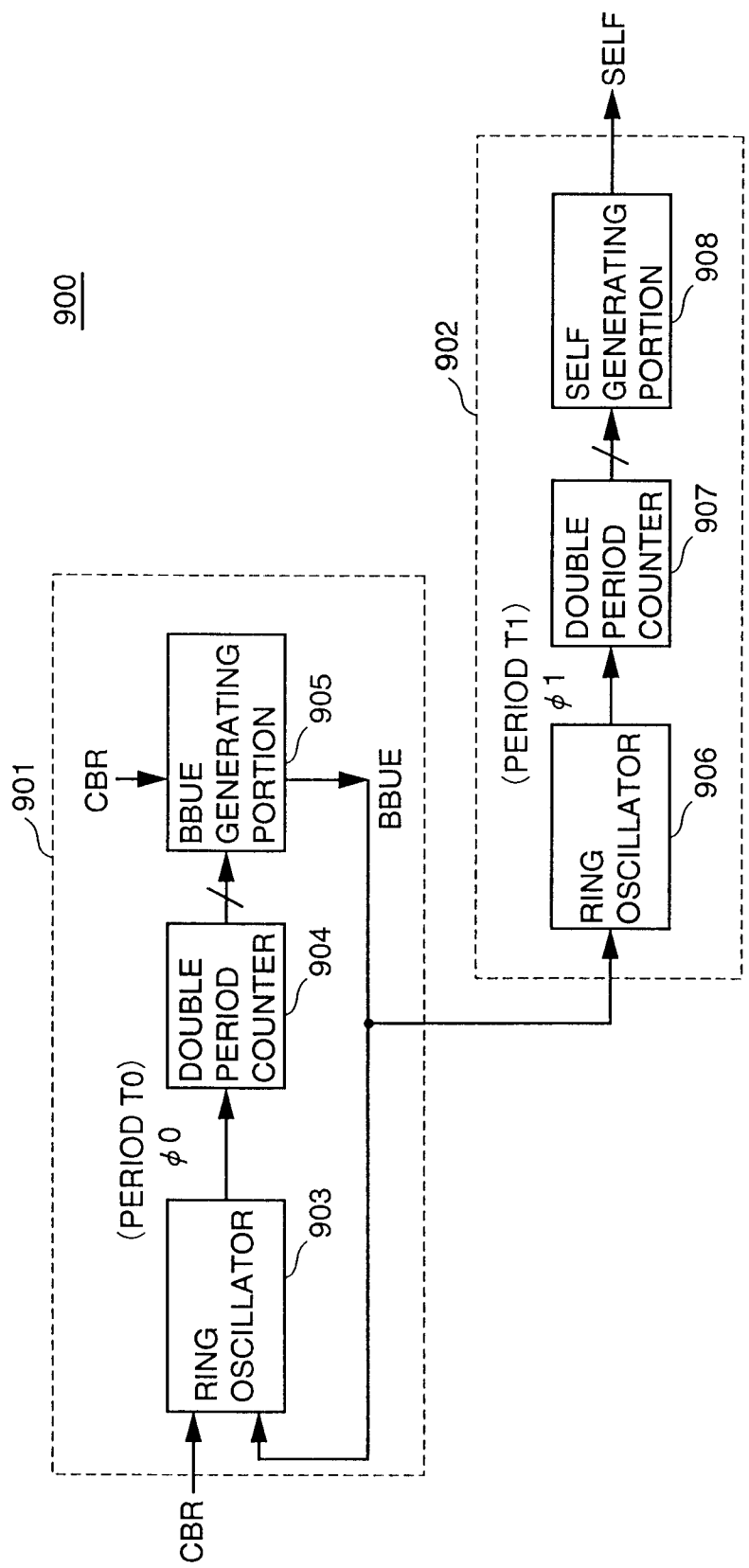
FIG. 13 is a block diagram showing a structure of a self-refresh circuit 900 in the prior art.
Figure 14:
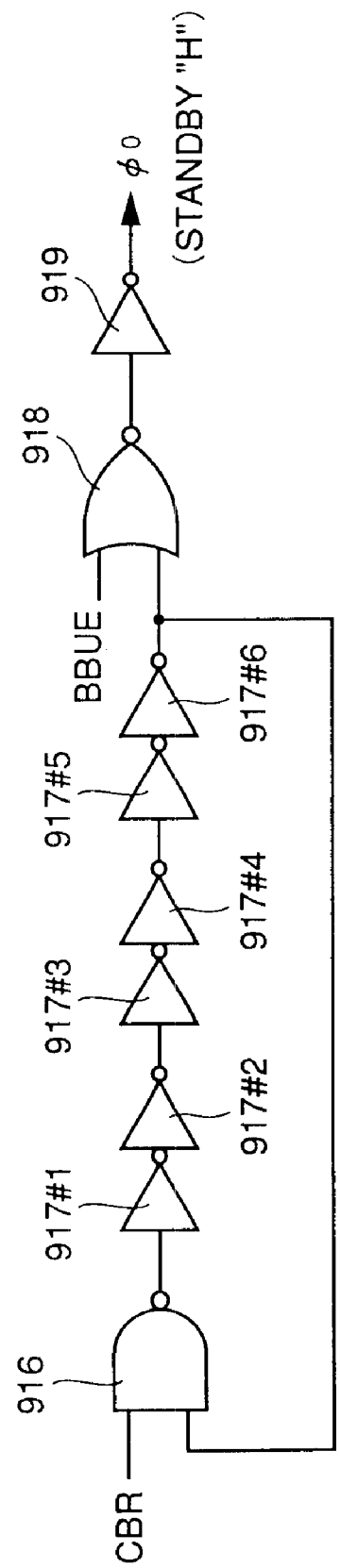
FIG. 14 is a circuit diagram showing a structure of a ring oscillator 903.
Figure 16:
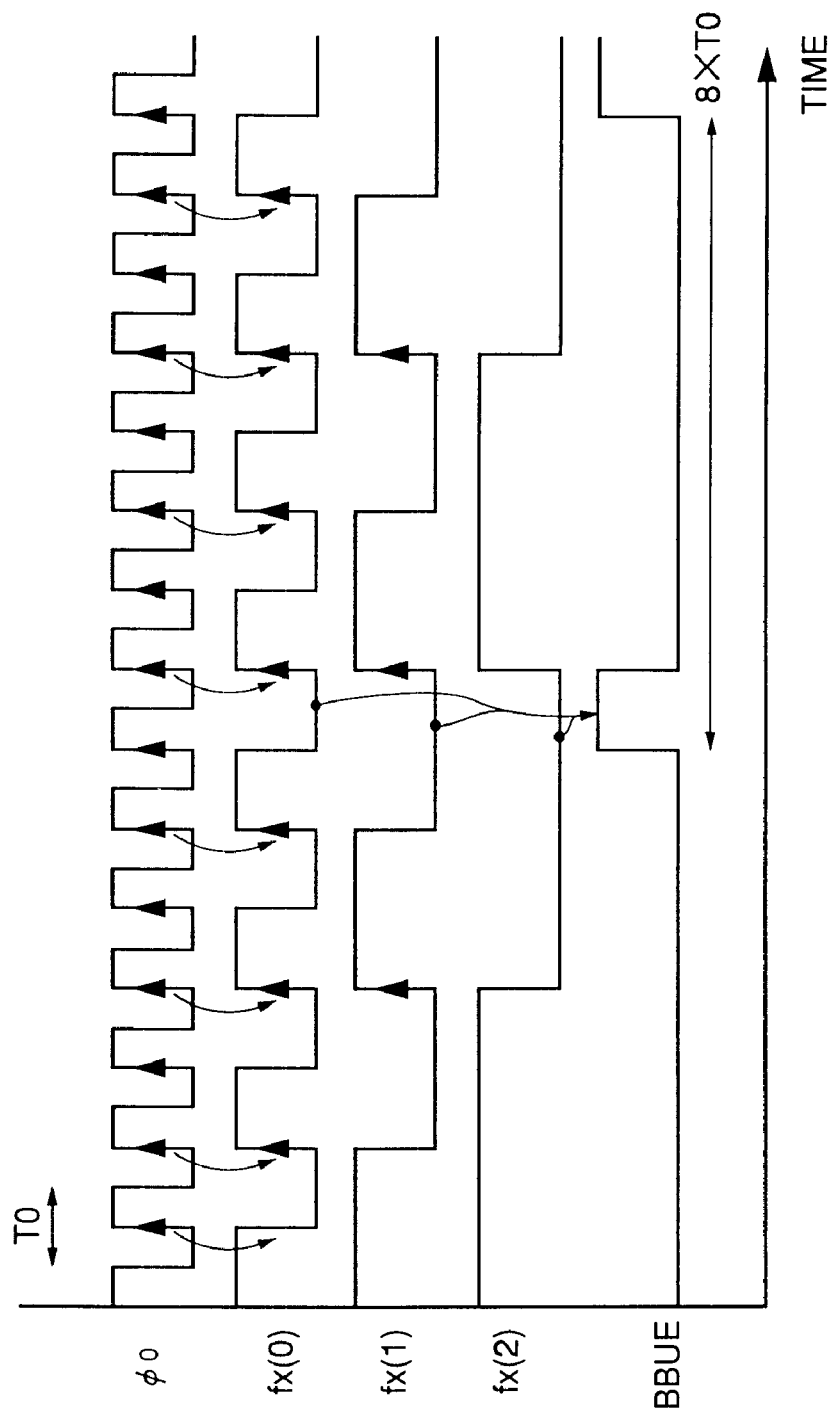
FIG. 16 is a timing chart for showing a BBUE signal.
Figure 17:
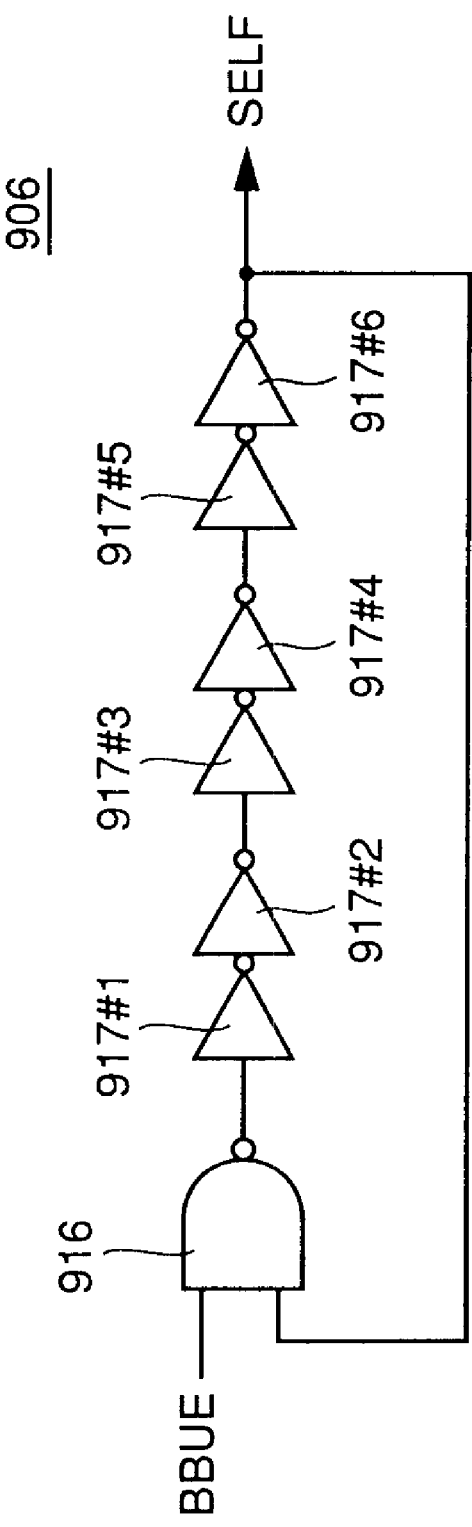
FIG. 17 is a circuit diagram showing a structure of a ring oscillator 906.
Figure 18:
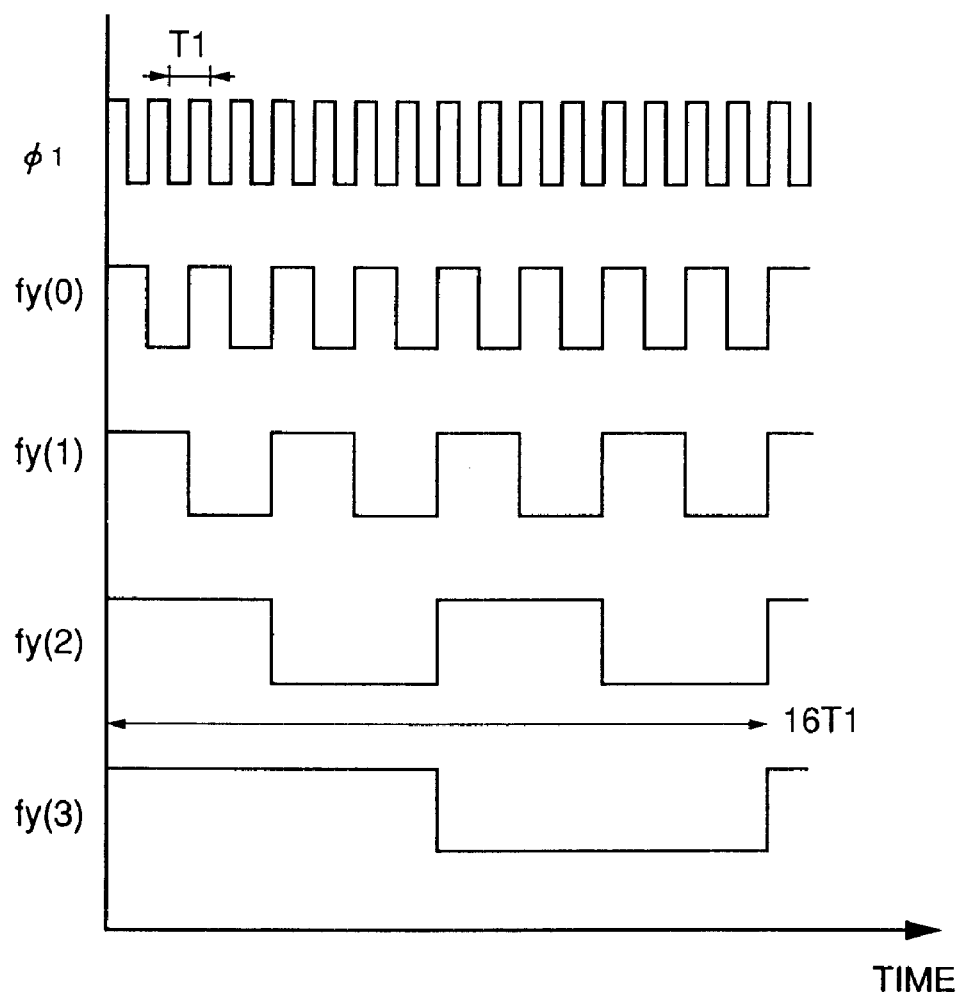
FIG. 18 is a timing chart for showing an operation of a double period counter 907.
Figure 19:
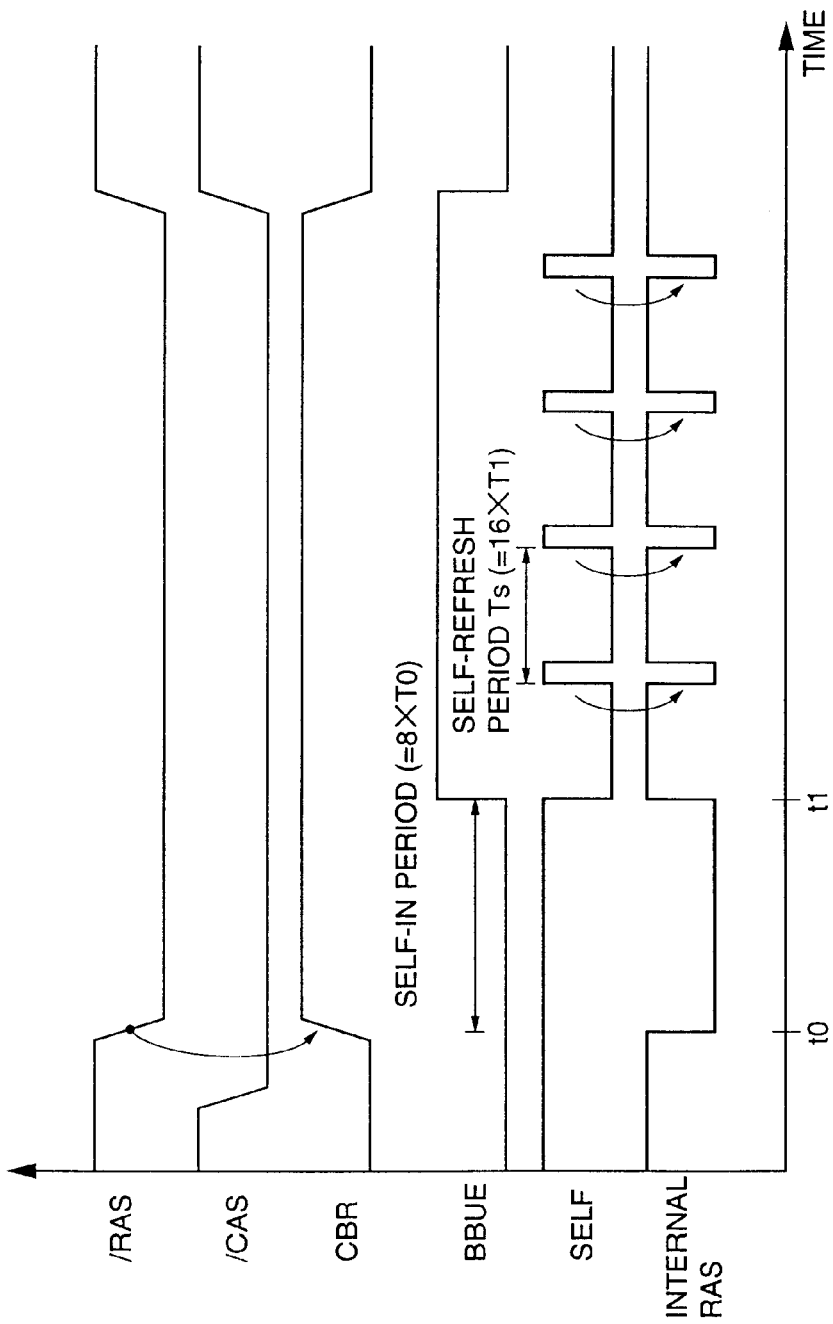
FIG. 19 is a timing chart for showing an operation of a conventional semiconductor integrated circuit in the self-refresh mode.

Fine adjusting circuit 135 includes circuits shown in FIG. 12. The circuits shown in FIG. 12 are provided for signal g0(0). Fine adjusting circuit 135 also have circuits, which have the same structure as that shown in FIG. 12 and can issue signal g0(1), and circuits, which have the same structure as that shown in FIG. 12 and can issue signal g0(2).

The structure shown in FIG. 12 includes a fuse 140, inverters 141 and 142, a resistance 143 and a PMOS transistor P3. Resistance 143 is connected between an external power supply voltage EXTVCC and a node N1, and fuse 140 is connected between ground voltage GND and node N1. Inverter 141 inverts the signal on node N1. Inverter 142 inverts the output of inverter 141, and issues signal g0(0). Transistor P3 is connected between external power supply voltage EXTVCC, resistance R and node N1, and is turned on in accordance with the output of inverter 141 for fixing the voltage on node N1.

When fuse 140 is blown by laser, signal g0(0) attains H-level. When laser-blow of fuse 140 is not performed, signal g0(0) is at L-level. When the laser blow is executed, signals g0(1) and g0(2) likewise attain H-level.

Referring to FIG. 11, the output of EXOR circuit 130 is at L-level when signals g(0) and g0(0) are at L-level, or when signal g(0) and g0(0) are at H-level. Thus, the signal at L-level is issued when the double period counter and the fine adjusting circuit issue the outputs of the same value.

For example, when signal g0(1) is set to H-level, and signals g0(0) and g0(2) are set to L-level, BBUE generating portion 304 generates the BBUE signal in accordance with the same timing as BBUE generating portion 204. By changing the positions of fuse(s) to be blown, the BBUE signal is issued in accordance with the timing different from that of BBUE generating portion 204.

By using the self-refresh circuit of the third embodiment of the invention, as described above, the layout area is reduced. Further, the rising timing of the BBUE signal can be easily set by changing the positions of the fuse(s) to be blown.

[Fourth Embodiment]

A self-refresh circuit of a fourth embodiment of the invention will now be described. In the first to third embodiments of the invention, the double period counter corresponding to the BBUE signal is supplied with signal f(3) as the basic signal determining the basic period. In contrast to this, the self-refresh circuit of the fourth embodiment of the invention employs, e.g., signal f(1) as the signal for determining the basic period of the double period counter.

For example, double period counter 203 is supplied on terminal QIN with signal f(1). Signal f(1) has a period of (2×T1). Assuming that period T1 is equal to 1 μs, signal f(1) has a period of (T1×4)=4 μs.

According to the self-refresh circuit of the fourth embodiment of the invention, therefore, the layout area can be reduced, and the rising timing of the BBUE signal can be determined in units of (4 μs×N) (N: natural number).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
a memory cell array including a plurality of memory cells arranged in rows and columns; and
a self-refresh circuit for issuing a self-refresh signal determining a self-refresh period for selection of the row in said memory cell array in a self-refresh mode,
said self refresh circuit including:
a ring oscillator receiving a specific signal and issuing an oscillation signal,
a counter receiving said oscillation signal, and issuing count signals of m bits (m: natural number),
a pulse signal generating circuit generating a pulse signal based on the count signals of m bits,
a self-in signal generating circuit for generating a self-in signal in response to the output of said counter after a predetermined period from entry of said specific signal, wherein said self-in signal generating circuit includes a self-in-capable counter using one of said count signals of m bits as a basic signal, and issuing count signals of n bits (n: natural number) and a generating circuit generating said self-in signal based on at least one of said count signals of n bits, and
a circuit for generating said self-refresh signal based on said pulse signal in response to said self-in signal.

2. The semiconductor integrated circuit according to claim 1, wherein
said predetermined period is K times (K relating to said n, and being an integer not equal to $2^n$) larger than the period of the basic signal supplied to said self-in-capable counter.

3. The semiconductor integrated circuit according to claim 1, wherein
said self-in signal generating circuit further includes a timing adjusting circuit having a fuse for issuing adjusting signals of L bits (L: natural number),
each of said adjusting signals of L bits has a logical level determined independently of the others in accordance with the state of said fuse, and
said generating circuit generates said self-in signal based on a combination of the count signals of n bits and the adjusting signals of L bits.

4. A semiconductor integrated circuit comprising:
a memory cell array including a plurality of memory cells arranged in rows and columns; and
a self-refresh circuit for issuing a self-refresh signal determining a self-refresh period for selection of the row in said memory cell array in a self-refresh mode,
said self refresh circuit including:
a ring oscillator receiving a specific signal and issuing an oscillation signal,
a counter receiving said oscillation signal and issuing count signals of m bits (m: natural number),
a pulse signal generating circuit generating a pulse signal based on the count signals of m bits,
a self-in signal generating circuit for generating a self-in signal in response to the output of said counter after a predetermined period from entry of said specific signal, wherein said predetermined period is substantially J times or (J+0.5) times larger than said self-refresh period (J: integer), and
a circuit for generating said self-refresh signal based on said pulse signal in response to said self-in signal.

5. A semiconductor integrated circuit comprising:
an oscillation circuit producing an oscillation signal;
a first control circuit outputting a first control signal controlling a first operation period based on said oscillation signal;

a double period counter producing a double period signal having the doubled period of said oscillation signal;

a second control circuit outputting a second control signal controlling a second operation period after said first operation period based on said double period signal, said second control signal being different from said first control signal in signal width.

6. The semiconductor integrated circuit according to claim 5, further comprising:

a circuit generating a third control signal serving as a control signal controlling said first and second operation periods based on said first and second control signals.

7. The semiconductor integrated circuit according to claim 6, wherein said oscillation circuit includes a ring oscillator, and a second double period counter producing a signal having the doubled period of an output signal of said ring oscillator, said second double period counter being different from said double period counter outputting said oscillation signal.

8. A semiconductor integrated circuit comprising:

a memory cell array including a plurality of memory cells arranged in rows and columns; and a self-refresh circuit for issuing a self-refresh signal determining a self-refresh period for selection of the row in said memory cell array in a self-refresh mode, said self refresh circuit including:

a ring oscillator receiving a specific signal and issuing an oscillation signal, a counter receiving said oscillation signal, and issuing count signals of m bits (m: natural number), a pulse signal generating circuit generating a pulse signal based on the count signals of m bits, a self-in signal generating circuit for generating a self-in signal in response to the output of said counter after a predetermined period from entry of said specific signal, and a circuit for generating said self-refresh signal based on said pulse signal in response to said self-in signal.

* * * * *